(12) United States Patent
Bradley et al.

(10) Patent No.: US 11,940,872 B2
(45) Date of Patent: Mar. 26, 2024

(54) ERROR CORRECTION CODE VALIDATION

(71) Applicant: Analog Devices International Unlimited Company, Limerick (IE)

(72) Inventors: Shaun Stephen Bradley, Patrickswell (IE); Bernard Sherwin Leung Chiw, Quezon (PH); Andreas G Callanan, Murroe (IE); Thomas J. Meany, Bruff (IE); Pat Crowe, Doon (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/726,123

(22) Filed: Apr. 21, 2022

(65) Prior Publication Data
US 2023/0342242 A1 Oct. 26, 2023

(51) Int. Cl.
*H03M 13/00* (2006.01)
*G06F 11/10* (2006.01)
*G11C 29/52* (2006.01)

(52) U.S. Cl.
CPC ...... *G06F 11/1044* (2013.01); *G06F 11/1068* (2013.01); *G11C 29/52* (2013.01)

(58) Field of Classification Search
CPC .......................... G06F 11/1044; G06F 11/1068
See application file for complete search history.

(56) References Cited

U.S. PATENT DOCUMENTS

| | | | |
|---|---|---|---|
| 5,502,732 A | * | 3/1996 | Arroyo ................... G11C 29/02 714/724 |
| 5,691,994 A | | 11/1997 | Bonke et al. |
| 5,991,911 A | | 11/1999 | Zook |
| 6,052,815 A | | 4/2000 | Zook |
| 6,092,231 A | | 7/2000 | Sze |
| 6,223,309 B1 | | 4/2001 | Dixon et al. |
| 7,149,947 B1 | | 12/2006 | Maclellan et al. |
| 7,203,890 B1 | | 4/2007 | Normoyle |
| 7,647,539 B2 | | 1/2010 | Bussa et al. |
| 7,984,359 B2 | | 7/2011 | Gorfajn et al. |
| 8,301,938 B2 | | 10/2012 | Cepulis et al. |
| 9,015,553 B2 | | 4/2015 | Asnaashari et al. |

(Continued)

FOREIGN PATENT DOCUMENTS

| | | |
|---|---|---|
| CN | 108665940 B | 9/2020 |
| CN | 116935940 | 10/2023 |

(Continued)

OTHER PUBLICATIONS

"European Application Serial No. 23168346.7, Extended European Search Report dated Aug. 8, 2023", 8 pgs.

*Primary Examiner* — Samir W Rizk
(74) *Attorney, Agent, or Firm* — Schwegman Lundberg & Woessner, P.A.

(57) ABSTRACT

A memory device comprising a memory array including memory cells to store memory data, error correcting code (ECC) circuitry configured to generate ECC data and use the ECC data to detect errors in the memory data, and an ECC circuitry checker. The ECC circuitry checker is configured to substitute the ECC data with check ECC data, compare an output of the ECC circuitry to an expected output when the substituted check ECC data is applied to the ECC circuitry, and generate an alert when the comparing indicates an error in the ECC circuitry.

19 Claims, 10 Drawing Sheets

(56) References Cited

U.S. PATENT DOCUMENTS

| | | |
|---|---|---|
| 9,483,210 B2 | 11/2016 | Olbrich et al. |
| 9,654,251 B1 | 5/2017 | Niesen et al. |
| 10,042,700 B2 | 8/2018 | Brandl |
| 10,108,512 B2 * | 10/2018 | Halbert ................. G06F 11/008 |
| 10,706,950 B1 | 7/2020 | Gallagher et al. |
| 11,061,767 B2 | 7/2021 | Zhu |
| 11,069,421 B1 * | 7/2021 | Refaeli .............. G11C 29/4401 |
| 2004/0225944 A1 | 11/2004 | Brueggen |
| 2011/0161774 A1 | 6/2011 | Shin et al. |
| 2012/0266033 A1 * | 10/2012 | Gold ....................... G11C 29/02 |
| | | 714/E11.02 |
| 2014/0215289 A1 * | 7/2014 | Trezise ............... G06F 11/1048 |
| | | 714/763 |
| 2018/0331692 A1 | 11/2018 | Gulati et al. |
| 2019/0088349 A1 | 3/2019 | Pyo et al. |
| 2019/0114220 A1 | 4/2019 | Stenfort |
| 2019/0176838 A1 | 6/2019 | Kakoee et al. |
| 2022/0318089 A1 * | 10/2022 | Sridharan ............. G06F 3/0659 |

FOREIGN PATENT DOCUMENTS

| | | | |
|---|---|---|---|
| EP | 1090462 B1 | 8/2005 | |
| EP | 2297742 A1 * | 3/2011 | .......... G06F 11/008 |

\* cited by examiner

ERROR CORRECTION CODE VALIDATION

BACKGROUND

Error detection is used in communications technology and memory technology to find erroneous data changes. There are many different approaches to erroneous data detection. One approach is to include error correction code (ECC) in devices to detect and correct errors. Another approach is cyclic redundancy checking that computes a cyclic redundancy code (CRC) to detect errors in data. Communications technology and memory technology are becoming included in embedded systems requiring a high degree of safety, such as embedded systems for automotive applications example. To achieve a high level of safety, it may be desirable to verify that the error detection is itself working correctly.

SUMMARY OF THE DISCLOSURE

This document relates generally to embedded computing systems, and in particular to techniques to validate the error detection in such systems by verifying that error detection algorithms are working correctly.

An example of a memory device includes a memory array including memory cells to store memory data; error correcting code (ECC) circuitry configured to generate ECC data and use the ECC data to detect errors in the memory data; and an ECC circuitry checker. The ECC circuitry checker is configured to substitute the ECC data with check ECC data, compare an output of the ECC circuitry to an expected output when the substituted check ECC data is applied to the ECC circuitry, and generate an alert when the comparing indicates an error in the ECC circuitry.

An example of a peripheral device of a computing system includes a bus interface and a bus ECC circuitry checker. The bus interface is configured to communicate data with one or more separate devices via the bus. The one or more separate devices include ECC circuitry configured to generate ECC data and use the ECC data to detect data errors in data communicated via the bus. The bus ECC circuitry checker is configured to force an error on the bus and compare a response of the one or more separate devices to the forced bus error to an expected response, and generate an alert when the comparing indicates an error in the ECC circuitry.

An example of a computing system includes a host device, a system bus, and a memory device. The memory device includes a bus interface, a memory array including memory cells to store memory data received from the host device via the bus, error detection circuitry configured to generate error detection data and use the error detection data to detect errors in the memory data, and a memory error detection circuitry checker. The memory error detection circuitry checker is configured to substitute the error detection data with check error detection data, compare an output of the error detection circuitry to an expected output when the substituted check error detection data is applied to the error detection circuitry, and generate an alert when the comparing indicates an error in the error detection circuitry.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
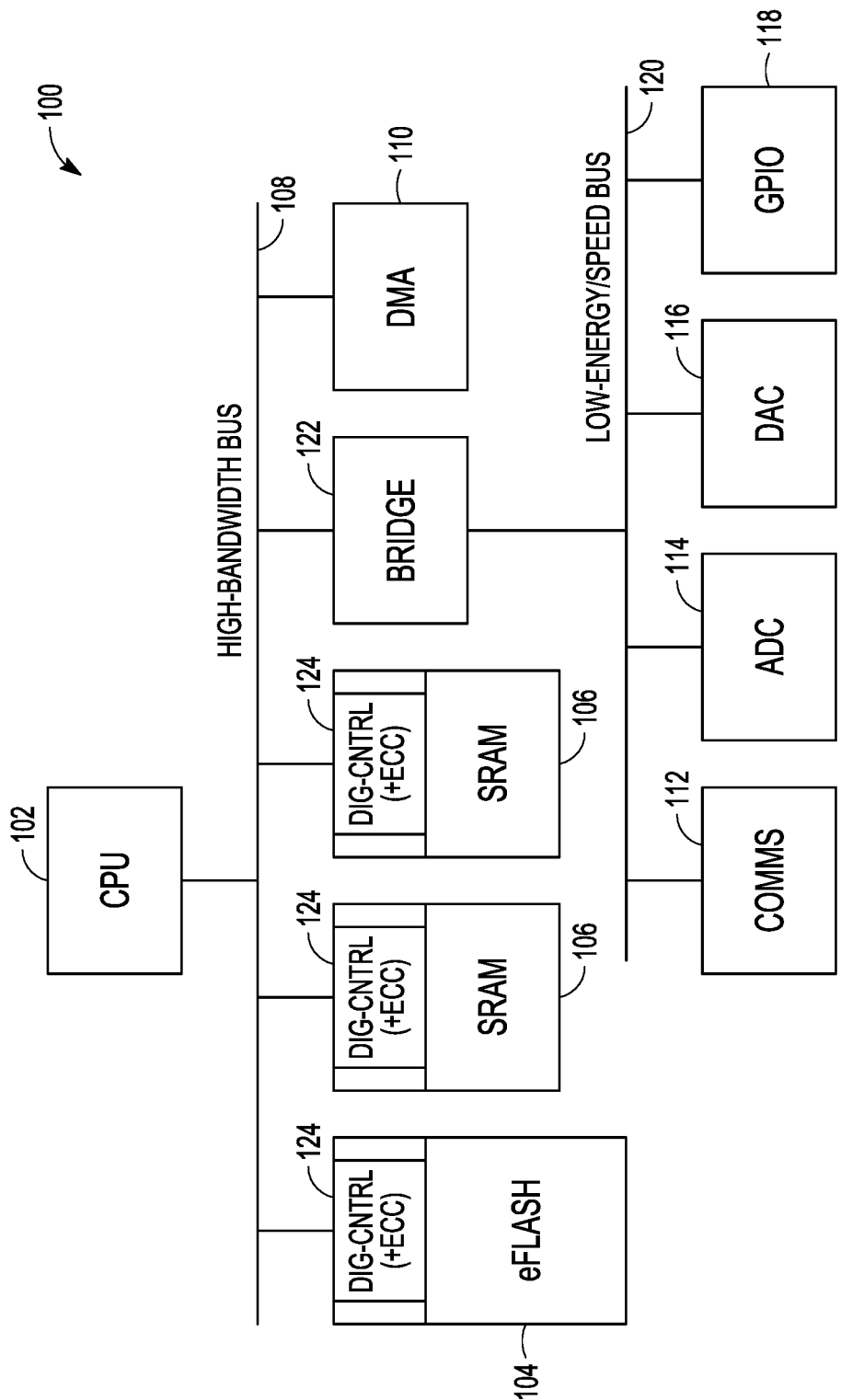
FIG. 1 is a block diagram of an example of a computing system.

FIG. 1 is a block diagram of an example of a computing system 100. The system may be distributed or centralized. The computing system 100 includes a host device 102 (e.g., a central processing unit or CPU), a FLASH memory device 104, and two static random access memory (SRAM) devices 106. In variations, the computing system can include other types of non-volatile memory (e.g., hard disk drive (HDD) memory, fused memory, and read only memory) and other types of volatile memory (e.g., static dynamic random access memory (SDRAM) and memory registers). The host device 102 communicates with the memory devices via a bus 108 (e.g., a high bandwidth bus). The computing system 100 may also include one or more peripheral devices such as a direct memory access (DMA) device 110. Other peripheral devices include a communications (Comms) device 112, analog-to-digital converter (ADC) 114, digital-to-analog converter (DAC) 116, and a general-purpose input-output (GPIO) device 118 that communicate via a second bus 120 (e.g., a low energy, lower speed bus). The computing system may also include a bridge device 122 to bridge data communications between the two buses.

Each memory device includes a memory array containing memory cells. The FLASH memory device 104 contains at least one FLASH memory array and the SRAM devices 106 each contain at least one SRAM array. The memory devices include ECC circuitry 124 for error detection in data written to and read from the memory array of the memory device. ECC includes algorithms that are used to encode bits of data such that errors in the data can be detected and possibly corrected. ECC techniques generally involve computing and appending an ECC to the original data, and storing the ECC with the original data or in association with the original data. The memory devices decode the stored ECC and use it to detect and correct errors in the data read from the memory array.

Figure 2:
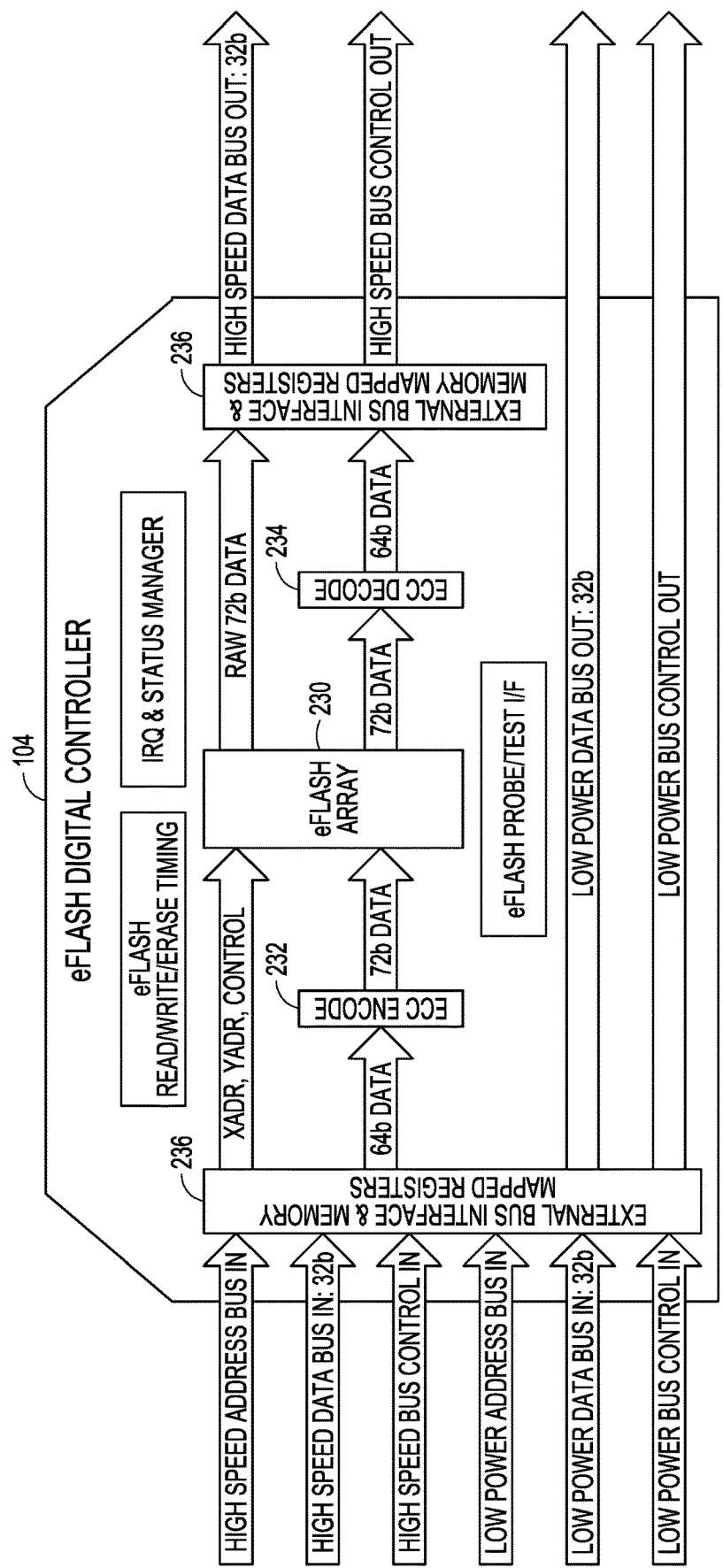
FIG. 2 is a block diagram of an example of a FLASH memory device.

FIG. 2 is a block diagram of an example of the FLASH memory device 104 of FIG. 1. The FLASH memory device 104 includes an embedded FLASH (eFLASH) array 230 containing eFLASH memory cells. The FLASH memory device 104 includes ECC encoding circuitry 232 and ECC decoding circuitry 234. The ECC circuitry detects errors in the writing and reading of data to the memory array. Data is received on bus interface 236 and 8 bits of ECC are generated using the ECC encoding circuitry 232. The original data plus the ECC code are stored in the eFLASH array 230. When the data is read from the eFLASH array 230, ECC decoding circuitry 234 decodes the 8-bit ECC code to detect if there is an error in the read data.

Typically, ECC algorithms are used to detect one-bit or two-bit errors and correct one-bit errors. Increasing ECC to correct more than one or two bits or detect more than two or three bits becomes overly large or can take a significant amount of time to calculate. Alternatively, the memory device can include CRC circuitry to detect errors in the data. Although CRC algorithms cannot correct errors, they can detect more errors than ECC in larger amounts of memory, but they can take time to calculate as many memory locations need to be read.

Embedded computer systems are becoming included in applications requiring a high level of safety, such as automotive, marine, and industrial robotic applications for example. If there is a problem with the error detection circuitry itself, it may be detectable at the time of manufacturing, but it may not be detectable in an implemented system. The defective error detection circuitry may not be detecting the errors it is intended to detect. To improve safety, circuitry to validate the error detection or verify proper operation of the error detection can be added to the embedded computer system 100.

Figure 3:
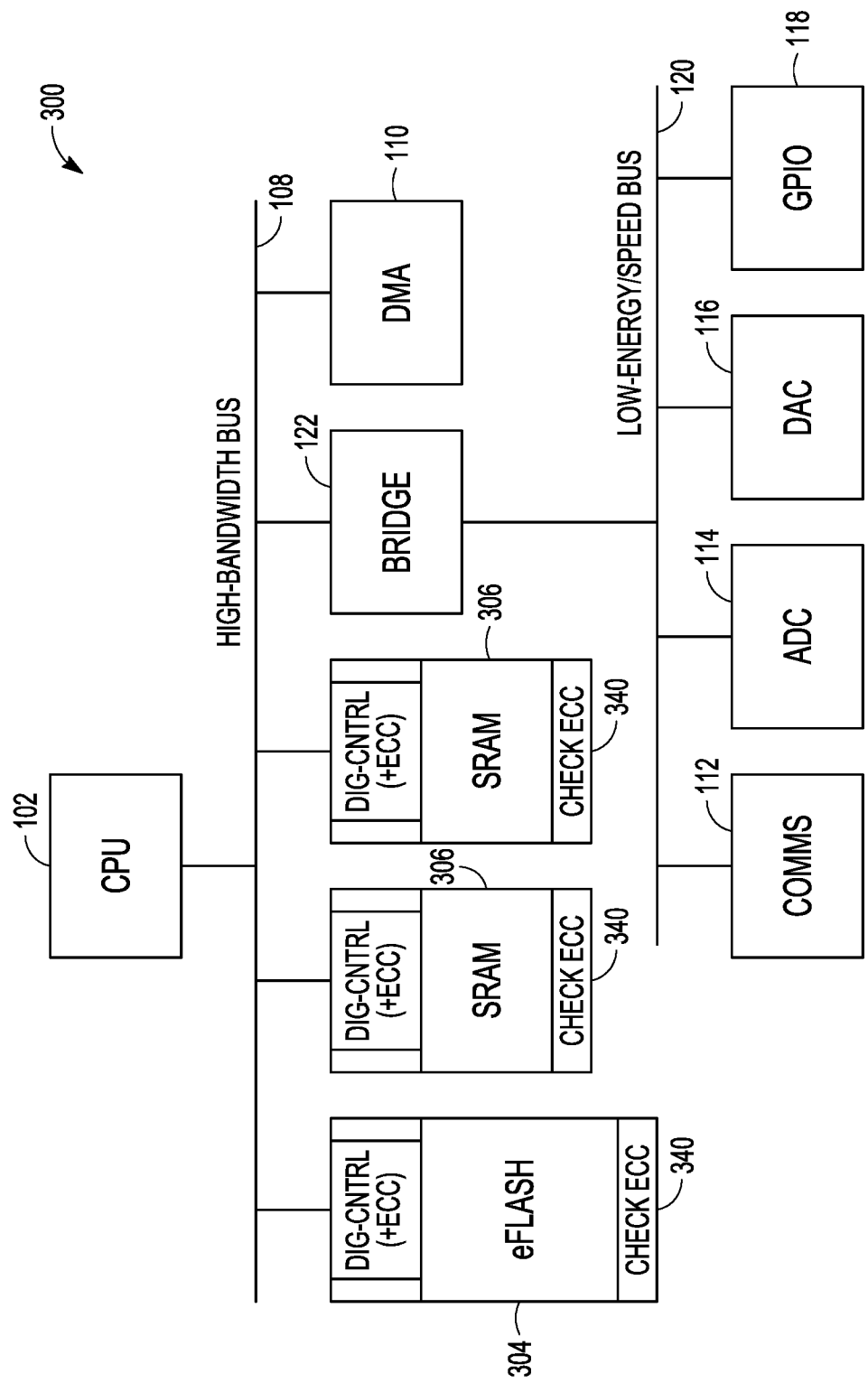
FIG. 3 is a block diagram of another example of a computing system.

FIG. 3 is a block diagram of another example of a computing system 300. The computing system 300 includes a FLASH memory device 304 and SRAM memory devices 306. The memory devices differ from the example of FIG. 1 in that the FLASH and SRAM memory devices include an ECC circuitry checker 340 that includes ECC checking circuitry to verify the operation of one or both of the ECC encoding circuitry and the ECC decoding circuitry.

Figure 4:
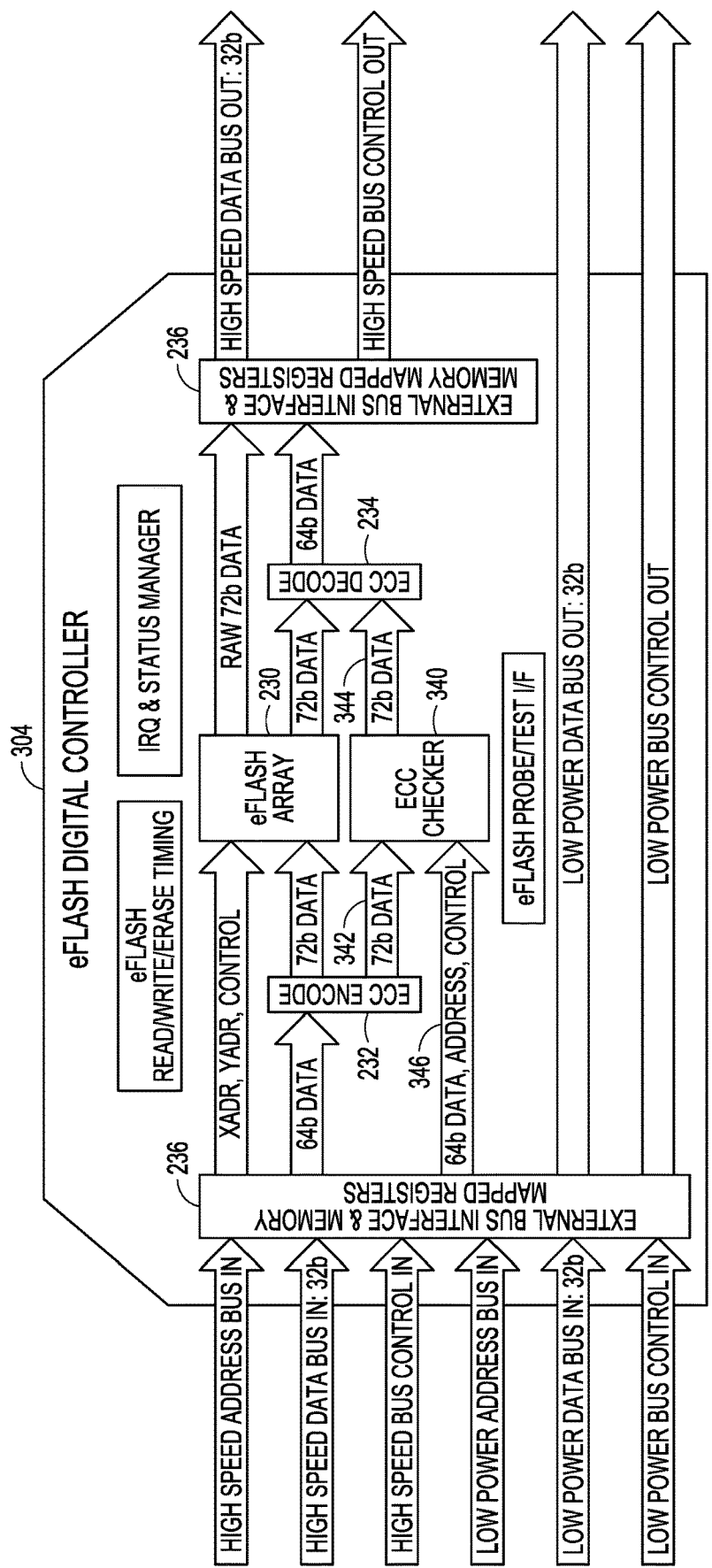
FIG. 4 is a block diagram of an example of the FLASH memory device with ECC circuitry checking.

FIG. 4 is a block diagram of an example of the FLASH memory device 304 with ECC circuitry checking. The FLASH memory device 304 includes an eFLASH array 230 containing eFLASH memory cells, ECC encoding circuitry 232, and ECC decoding circuitry 234. The FLASH memory device 304 also includes an ECC circuitry checker 340. In an example, the ECC circuitry checker 340 may substitute the actual ECC data generated from the memory data with check ECC data. The ECC circuitry checker 340 compares the resulting output of the ECC circuitry to an expected output when the substituted check ECC data is applied to the ECC circuitry. For example, the substituted check ECC data may be data intended to cause a known error. If a problem is detected (e.g., the error does not occur, or an unexpected error occurs), the ECC circuitry checker 340 generates an alert that there is an error in the ECC circuitry. This alert may be an error message sent to the host device, or an error indicated using a status line.

The ECC circuitry checking of the memory device adds a data path 342 between the ECC encoding circuitry 232 and the ECC circuitry checker 340, a data path 344 between the ECC circuitry checker 340 and the ECC decoding circuitry 234, and a data path 346 between the bus interface 236 and the ECC circuitry checker 340. In an example, to check the ECC circuitry, the ECC circuitry checker 340 may apply the substituted check ECC data using data path 344, and apply either the memory data or substituted memory data to the ECC decoding circuitry 234. The ECC circuitry checker 340 compares the output of the ECC decoding circuitry 234 to an expected output. If the expected result occurs, the ECC decoding circuitry 234 may do nothing or may log the result. If an unexpected result occurs, the ECC decoding circuitry 234 may send the alert to the host device or log the error.

In another example, the ECC circuitry checker 340 may store check ECC data with the memory data instead of the actual the ECC data generated for the memory data. The substituted check ECC data is provided with the memory data in response to a read operation instead of the generated ECC data. The ECC circuitry checker 340 compares the output of the ECC decoding circuitry 234 for the read operation to an expected output (e.g., an expected error). In another example, the ECC circuitry checker 340 may substitute or change the actual memory data with check memory data and use the ECC data generated from the original memory data. In another example, the ECC circuitry checker 340 may substitute both the memory data and ECC data generated for the memory data with check data.

Figure 5:
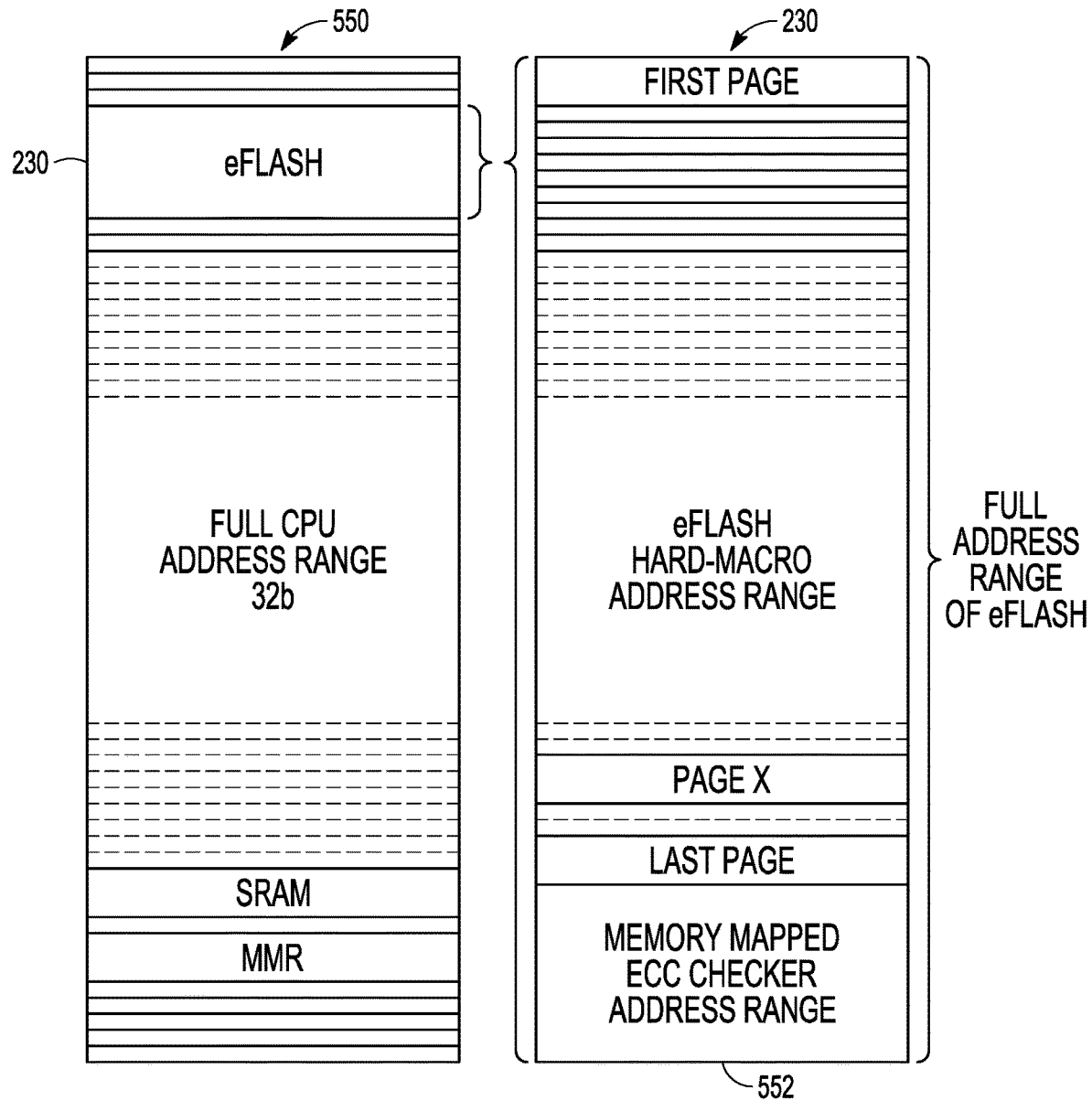
FIG. 5 is an illustration of memory address space for the computing system of FIG. 3.

The ECC circuitry checker 340 may use memory mapping to access one or both of check ECC data and check memory data for the ECC verification operations. FIG. 5 is an illustration of memory address space 550 for the example computing system 300 of FIG. 3. The memory address space 550 includes the eFLASH memory 230. The memory space for the eFLASH memory 230 includes a memory mapped address range 552 for the ECC circuitry checker 340. The memory mapped address range 552 may be accessed using an address on data 346. In some examples, the memory mapped address range 552 may be accessed by translating a write or read address when a control signal is asserted to initiate an ECC checking operation. Check ECC data may be retrieved from the memory address mapped portion of the memory array in response to a read operation, and the ECC circuitry checker may substitute the check ECC data for the ECC data generated for the memory data of the read operation. The memory mapped portion of the memory may contain precomputed or other predetermined values, that can be used as one or both of ECC data and memory data, that mathematically validates the function of the ECC logic circuitry.

Figure 6:
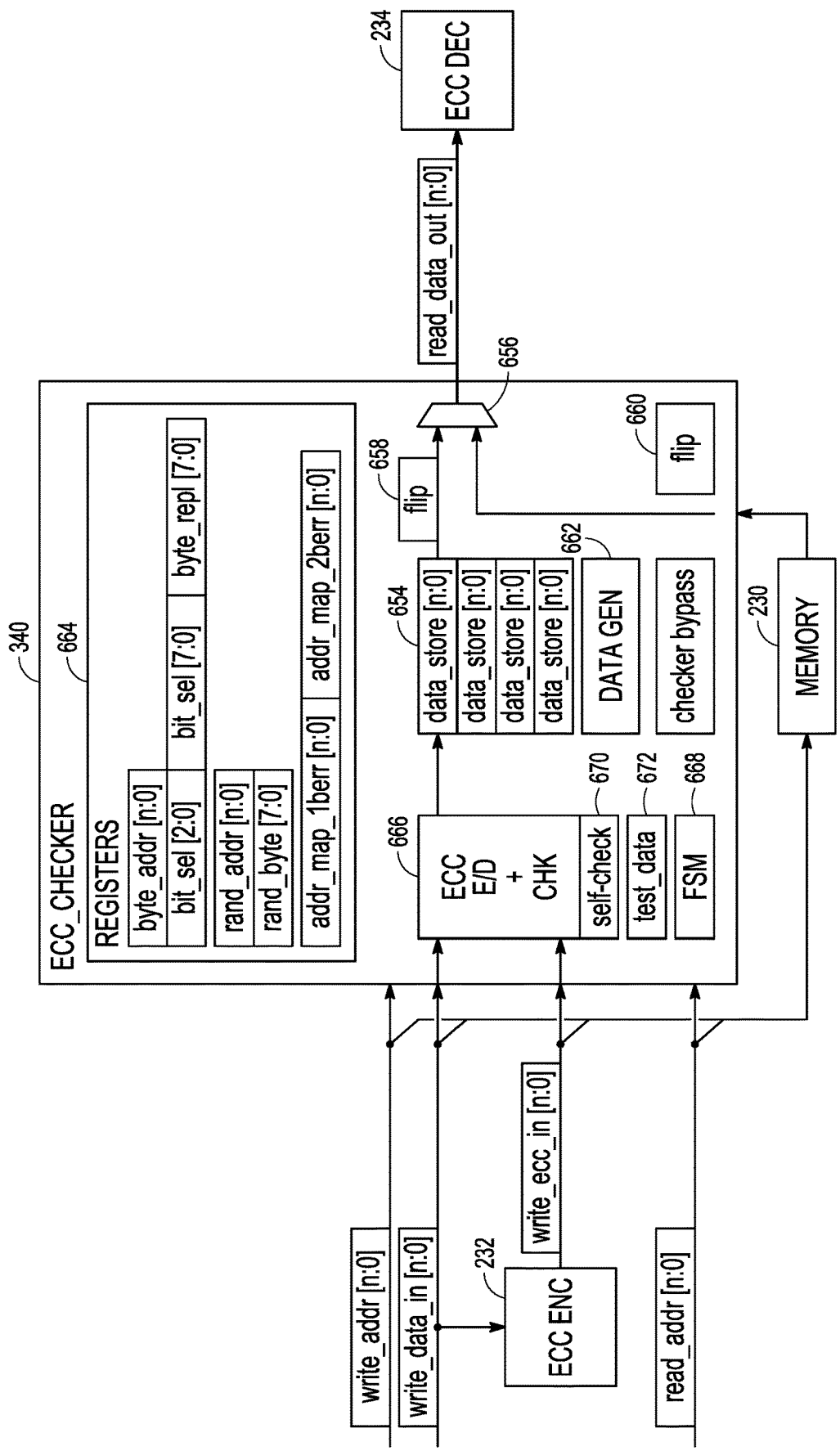
FIG. 6 is a functional block diagram of an example of a memory error correction code circuitry checker.

FIG. 6 is a functional block diagram of an example of a memory ECC circuitry checker 340. The ECC circuitry checker 340 interfaces to ECC encoding circuitry 232, ECC decoding circuitry 234, and memory 230. The memory may be eFLASH memory (e.g., of FLASH memory device 304 of FIG. 3) or SRAM memory (e.g., of SRAM memory device 306 of FIG. 3).

The block diagram of FIG. 6 shows multiple methods of manipulating the ECC data and the memory data for validation of the ECC circuitry of a memory device. The ECC circuitry checker 340 may include data storage registers 654 to store ECC check data. The ECC check data may be set or programmed by the manufacturer or may be programmed by a user. The ECC circuitry checker 340 may include a multiplexer circuit 656 to select between providing actual ECC data stored in the memory 230 to the ECC decoding circuit or substituting the ECC check data from the data storage registers 654. The multiplexer circuit 656 may also be used to substitute the memory data from memory 230 with simulated memory data stored in the data storage registers 654. The substituted ECC data or memory data can provide a predetermined ECC error to see if the ECC decoding detects and possibly correct the error, or the data can simulate a failure in the ECC encoding circuitry 232 to see if the problem is detected by the ECC circuitry.

Alternatively, or additionally, to the data storage registers, the ECC circuitry checker 340 can include bit flip logic circuitry 658, 660. The bit flip logic circuitry 658 can flip at least one bit of ECC data stored in the data storage registers 654 to generate the check ECC data and provide the generated check ECC data to the ECC decoding circuitry instead of the ECC data for the memory data. If the data storage registers 654 store memory data, the bit flip logic circuitry 658 can flip at least one bit of memory data stored in the data storage registers 654. The bit flip logic circuitry 660 can flip at least one bit of ECC data stored in the memory 230 to generate the check ECC data. The bit flip logic circuitry 660 may also flip at least one bit of memory data stored in the memory 230. One or both of altered ECC data and altered memory data are provided to the ECC decoding circuitry 234 to verify operation of the ECC decoding circuitry 234.

In some examples, the ECC circuitry checker 340 includes data generation logic circuitry 662. The data generation logic circuitry 662 can generate one or both of ECC check data and simulated memory data as check data. The generated data can be used to verify the ECC decoding circuitry 234. In some examples, the bit flip logic circuitry 658 can be used to flip at least one bit of the data generated by the data generation logic circuitry 662.

In some examples, the ECC circuitry checker 340 can include memory mapped registers 664. The memory mapped registers 664 provide different ways to cause the ECC circuitry checker 340 to corrupt ECC data or memory data. For instance, writing an address to register "byte_addr [n:0]" causes the ECC circuitry checker 340 to corrupt the data at that address. Registers "bit_sel[2:0]", "bit_sel[7:0]", and "byte rep[7:0]" can be used to specify the data. Writing register "rand_addr[n:0]" corrupts a random address with the data in "rand byte[7:0]" every access. Registers "addr_map_1berr[n:0]" and "addr_map_2berr[n:0]" can be used to designate ranges of addresses for corrupting.

In some examples, the ECC circuitry checker 340 includes an ECC Error Detection Check (ECC_E/D+CHK) module 666. The ECC_E/D+CHK module 666 can include logic circuitry to perform the functions described. In certain examples, the ECC_E/D+CHK module 666 can include a processor (e.g., a microprocessor) to perform the functions described. The ECC_E/D+CHK module 666 may verify operation of the ECC encoding circuitry 232 by regenerating the ECC code from the memory data and comparing the parity of the incoming ECC code and the regenerated ECC code. The ECC circuitry checker 340 may generate an alert when the parity does not match. In some examples, the ECC_E/D+CHK module 666 may verify operation of the ECC circuitry of the memory device by decoding the ECC code generated by the ECC encoding circuitry 232 and checking the decode result of the ECC decoding circuitry 234. If the ECC decoding result is not the same, the ECC circuitry checker 340 may generate an alert.

In some examples, the ECC circuitry checker 340 is activated in response to a command from a separate device, such as a host device. For example, the host device includes software or firmware to initiate a verification of the operation of the ECC circuitry. In some examples, the separate device uses a write operation to write the data storage registers 654 or the memory mapped registers 664 to verify operation of the ECC circuitry. In some examples, the ECC circuitry checker 340 recurrently initiates verification of the ECC circuitry. The ECC circuitry checker 340 may include a finite state machine (FSM) 668. The FSM 668 includes logic circuitry to recurrently perform an ECC checking operation, such as by using one or more of the data storage registers 654, the memory mapped registers 664, bit flip logic circuitry 658, and ECC_E/D+CHK module 666. The FSM 668 may be designed to initiate an ECC checking operation according to a schedule, or when a predetermined number of memory operations have been performed.

It should be noted that the ECC circuitry checker 340 may cause intended errors in the ECC verification operations. If an expected error occurs, the ECC circuitry checker 340 may not return status, or the ECC circuitry checker 340 returns error status to the host device. If the error is expected from the verification of the ECC circuitry, the host device may do nothing. If no error is returned when an error is expected, the host device may generate an alert or log the event.

The ECC circuitry checker 340 may perform self-checking to verify its own operation. In some examples, the ECC circuitry checker 340 includes a self-check (self-chk) module 670 that feeds test data 672 to the ECC_E/D+CHK module 666 to verify correct operation of the ECC_E/D+CHK module 666. The test data 672 can be written into one or more registers (e.g., by a user), or can be hard-coded (e.g., at time of manufacture).

Figure 7:
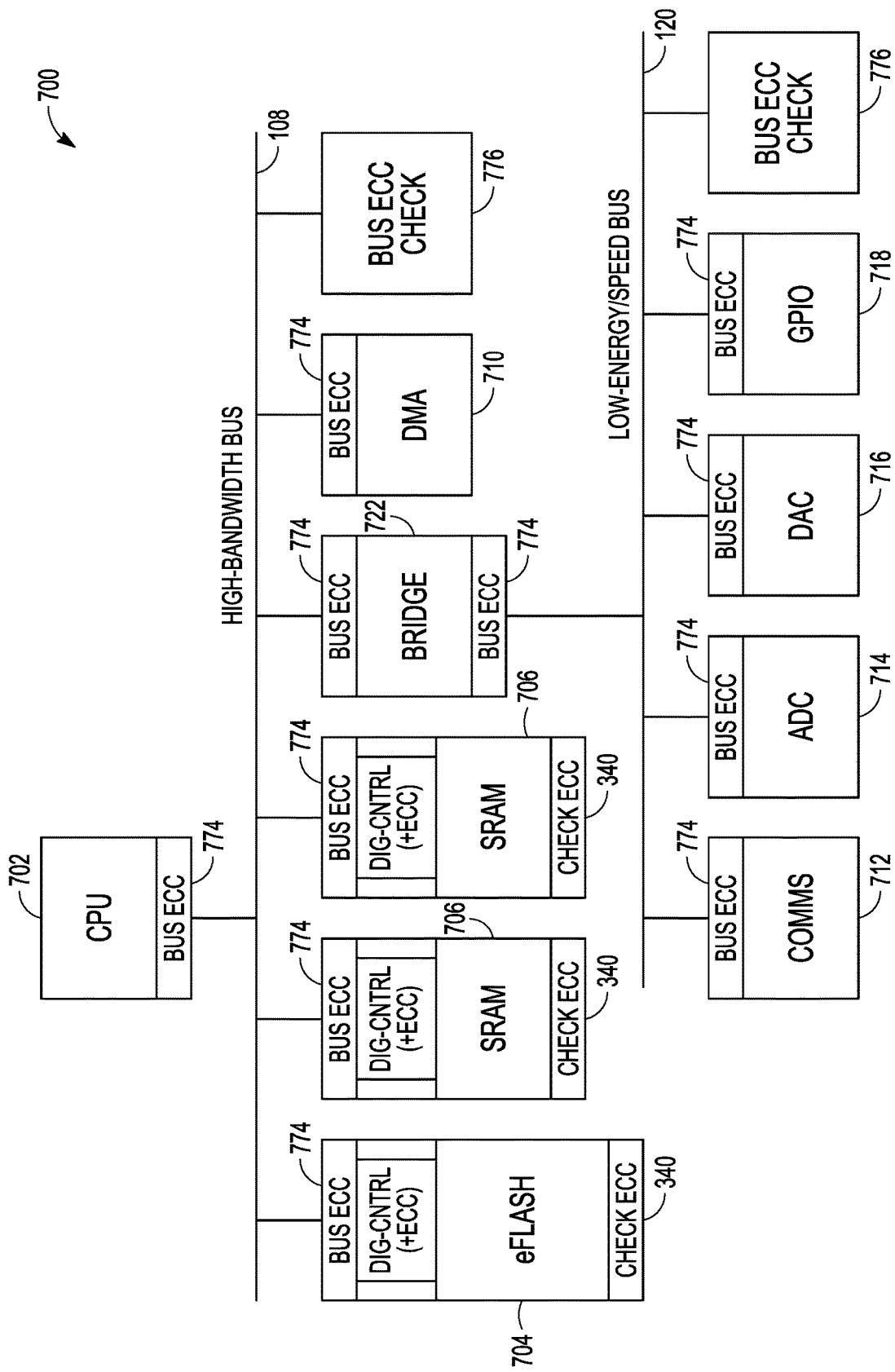
FIG. 7 is a block diagram of another example of a computing system.

FIG. 7 is a block diagram of another example of a computing system 700. The computing system 700 includes a FLASH memory device 704 and SRAM memory devices 706. The memory devices differ from the memory devices of example of FIG. 3 in that the FLASH and SRAM memory devices include bus ECC circuitry 774 that uses ECC to detect errors in data transmit on the first bus 108 and the second bus 120. The ECC bus circuitry adds ECC data to one or both of data and addresses the devices place on a bus, and decodes ECC data to detect errors in one or both of data and addresses the devices receive via a bus. In some examples, packets of data are communicated among the devices via the bus and ECC data is appended to the payload of a packet.

The computing system 700 also includes peripheral devices DMA device 710, Comms device 712, ADC 714, DAC 716, GPIO device 718, and bridge device 722. The peripheral devices also differ from the peripheral devices of FIG. 3 in that the peripheral devices include bus ECC circuitry 774. Host device 702 also includes bus ECC circuitry 774 to detect errors in information communicated via the buses. For a system requiring a high level of safety, it may be desirable to verify the operation of the bus ECC circuitry of the memory devices and peripheral devices of the computing system 700.

The computing system 700 includes a peripheral device that is a bus ECC circuitry checker 776. The example of FIG. 7 shows a bus ECC circuitry checker 776 connected to each of the two buses, but the computing system 700 may include only one bus ECC circuitry checker on either of the buses. The bus ECC circuitry checker 776 is a subsystem that forces an error on the bus and compares a response of the one or more of the other devices to the forced bus error to an expected response (e.g., an expected error response). The bus ECC circuitry checker 776 may operate as a target peripheral device that responds to read and write requests from other devices of the computer system to check the bus ECC circuitry 774 of the devices. Alternatively, or additionally, the bus ECC circuitry checker 776 may operate as an initiator peripheral device that initiates read and write requests to the other devices to check the bus ECC circuitry 774 of the devices.

Figure 8:
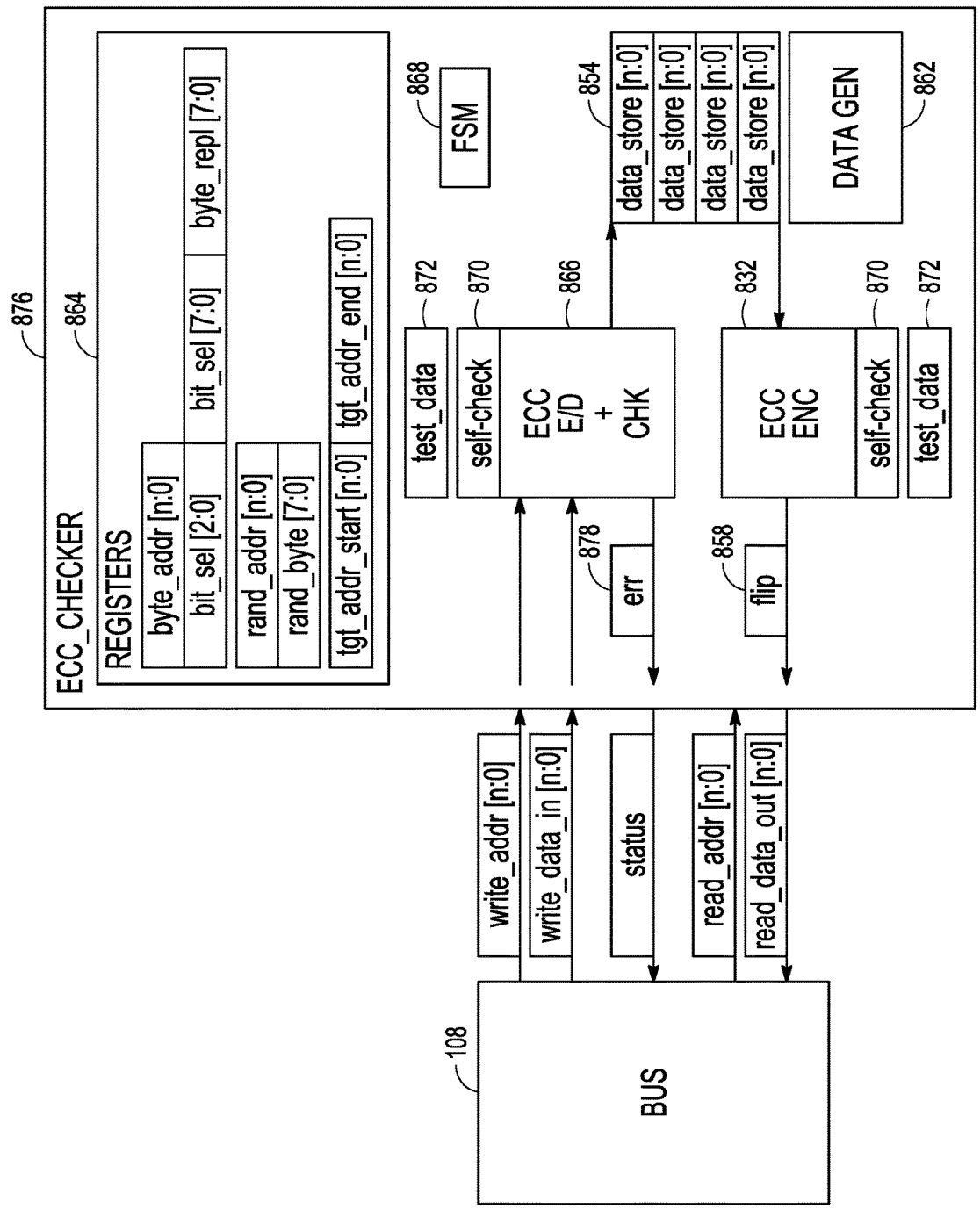
FIG. 8 is a functional block diagram of an example of a bus ECC circuitry checker.

FIG. 8 is a functional block diagram of an example of a bus ECC circuitry checker 876. The bus ECC circuitry checker 876 may be used as a bus ECC circuitry checker 776 in FIG. 7. The bus ECC circuitry checker 876 is shown connected to higher bandwidth bus 108, but the bus ECC circuitry checker 876 may be connected to the lower bandwidth bus 120. The bus ECC circuitry checker 876 is a target peripheral device. The bus ECC circuitry checker 876 includes data storage registers 854 that can be written to and read from by the other devices of the computing system 700. The data storage registers 854 have an address or range of addresses accessible by devices of the computer system.

The bus ECC circuitry checker 876 includes logic circuitry that initiates a response to a write request. The logic circuitry may be included in an FSM 868 or included in an ECC_E/D+CHK module 866. In response to a write request, the bus ECC circuitry checker 876 asserts an error status 878 for the request, such as would result if the ECC data of the write request indicated an error in one or both of the write data and the write address included in the response. The error status may be returned randomly on randomly selected write requests. In variations, the bus ECC circuitry checker 876 may corrupt incoming write data or ECC data to force the error.

ECC_E/D+CHK module 866 may verify that the ECC data of the write request is correct whether an error is returned or not. In some examples, the bus ECC circuitry checker 876 includes ECC decoding circuitry to decode the ECC data received in the write request and the ECC_E/D+CHK module 866 checks the write request for errors using the decoded ECC data. In some examples, the bus ECC circuitry checker 876 includes ECC encoding circuitry 832. The bus ECC circuitry checker 876 generates its own ECC data over one or both of the write data and the write address and compares the generated ECC data with the received ECC data (e.g., by comparing the parity of the two sets of ECC data). Detected errors may be logged by the bus ECC circuitry checker 876.

The logic circuitry of the bus ECC circuitry checker 876 also initiates a response to a read request. The read request is for data stored in the data storage registers 854. The bus ECC circuitry checker 876 forces an error in the response to the read request. In some examples, the ECC encoding circuitry 832 adds ECC data to a response to a read request. The bus ECC circuitry checker 876 may include bit flip logic circuitry 858 to flip a bit in one or both of the read data and the ECC data to force an ECC error. In some examples, the bus ECC circuitry checker 876 includes data generation logic circuitry 862 that outputs read data for the read request response.

The bus ECC circuitry checker 876 may include one or more self-check modules 870 that feed test data 872 to one or both of the ECC_E/D+CHK module 866 and ECC encoding circuitry 832 to verify correct operation of the ECC_E/D+CHK module 866 and ECC encoding circuitry 832. The test data 872 can be written into one or more registers or can be hard-coded. In some examples, the bus ECC circuitry checker 876 includes memory mapped registers 864 The memory mapped registers 864 provide different ways to designate the address of the data to corrupt. For instance, the "byte-addr[n:0]" register can be used to designate a specific address to corrupt. The "rand_addr[n:0]" register can be used to randomly select one address to corrupt every access. The "tgt_addr_start[n:0]" and "tgt_addr_end[n:0]" registers can be used to designate a range of addresses to corrupt.

Figure 9:
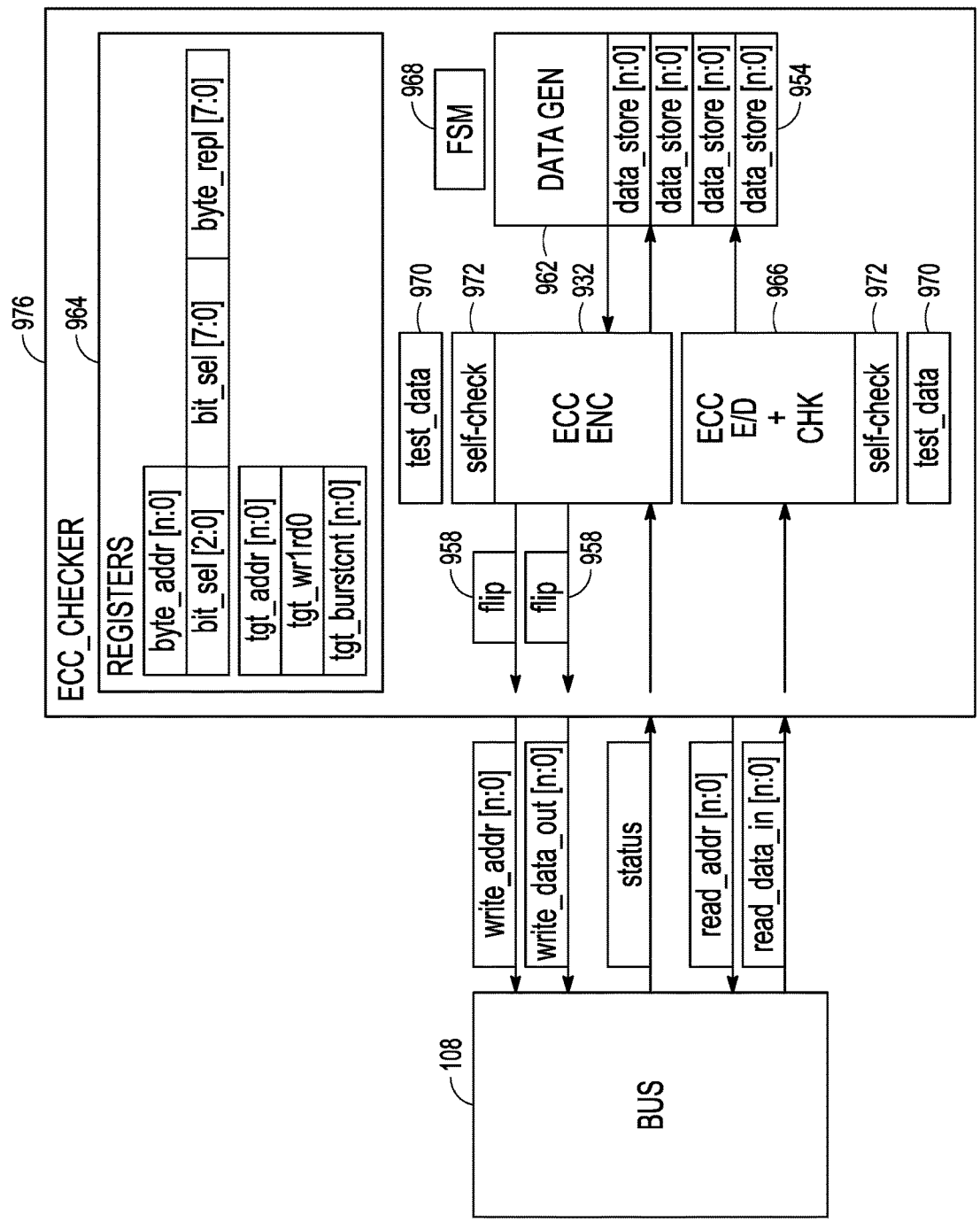
FIG. 9 is a functional block diagram of another example of a bus ECC circuitry checker.

FIG. 9 is a functional block diagram of another example of a bus ECC circuitry checker 976. The bus ECC circuitry checker 976 may be used as a bus ECC circuitry checker 776 in FIG. 7. The bus ECC circuitry checker 976 operates as an initiator peripheral device that initiates read and write requests to the other devices of the computing system to check the bus ECC circuitry 774 of the devices. The bus ECC circuitry checker 976 includes logic circuitry that initiates a write request to any of the host device, memory devices, or peripheral devices of the computing system 700. The logic circuitry may be included in an FSM 968 or included in an ECC_E/D+CHK module 966.

The write request includes a write address, write data, and ECC data. One or both of the write data and write address for the request may be stored in data storage registers 954 or the write data for a write request may be generated using data generation logic circuitry 962. The bus ECC circuitry checker 976 may include ECC encoding circuitry 932 to generate ECC data for the write request. The bus ECC circuitry checker 976 forces an error in one or more of the write data, write address, and ECC data. The bus ECC circuitry checker 976 may include bit flip logic circuitry 958 to flip a bit of at least one of the write data, write address, and ECC data to force the error.

The bus ECC circuitry checker 976 compares a returned status of the write request to an expected returned status. For example, if the bus ECC circuitry checker 976 forced an error in the write request, the bus error circuitry compares a returned status to an expected error status. The error status may include error information such as the number of bits on error, the byte that contained the error, etc.

The logic circuitry of the bus ECC circuitry checker 976 also initiates sending a read request to any of the host device, memory devices, or peripheral devices of the computing system 700. The bus ECC circuitry checker 976 includes ECC decoding circuitry that checks the ECC data received in the read request for errors. The bus ECC circuitry checker 976 may recurrently send a read request to predetermined devices according to a schedule programmed into the bus ECC circuitry checker 976. In some examples, the read request is for data previously written to a separate device by the bus ECC circuitry checker 976 using a write request. The ECC_E/D+CHK module 966 may compare read data to data contained in the data storage registers 954.

The ECC_E/D+CHK module 966 may store ECC parity bits generated by the ECC encoding circuitry 932 and may generate an alert when the parity does not match. The bus ECC circuitry checker 976 may include one or more self-check modules 972 that feed test data 970 to one or both of the ECC_E/D+CHK module 966 and ECC encoding circuitry 932 to verify correct operation of the ECC_E/D+CHK module 966 and ECC encoding circuitry 932. The test data 970 can be written into one or more registers or can be hard-coded.

In some examples, the ECC circuitry checker 340 can include memory mapped registers 964. Registers "tgt_addr" and "tgt_burstcnt[n:0]" can be written by a user to create a target bus access command performed by the bus ECC circuitry checker 976. Register "tgt_wr1rd0" can be used to designate the command as a write or read, or the command may automatically perform write then read by the bus ECC circuitry checker 976.

Several systems and devices are described herein that include ECC to detect and correct errors in memory operations and bus operations. In variations, the systems and devices include CRC detection circuitry to detect errors in the memory operations and bus operations. Protecting data using CRC is not able to correct errors, but CRC is able to detect more errors than ECC. Which approach to use may be determined by requirements of the application of the computing system.

Figure 10:
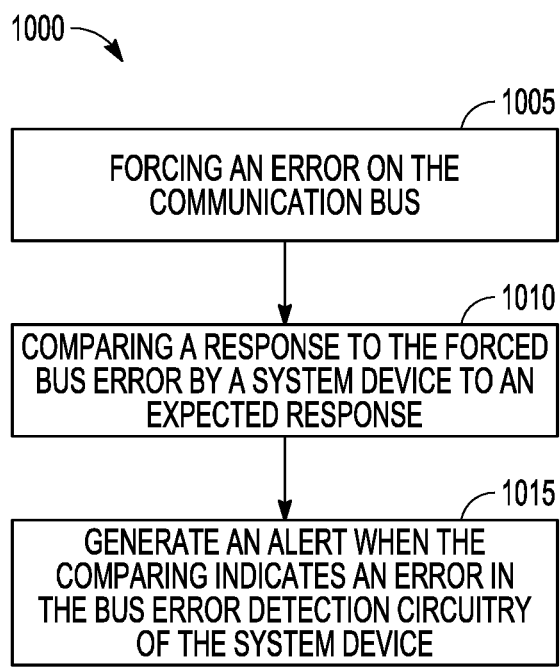
FIG. 10 is a flow diagram of an example of a method of validating error detection circuitry of a computing system.

FIG. 10 is a flow diagram of an example of a method 1000 of validating error detection circuitry of a computing system by verifying that the error detection circuitry is working properly and is not missing detection of errors (false negatives) or not detecting invalid errors (false positives). The computing system includes at least one host device, one or more memory devices, and one or more peripheral devices. The computing system may be distributed and the devices may communicate by sending packets of data over one or more communication buses. The devices of the system include bus error detection circuitry to detect errors in information communicated over the bus or buses. The error detection may use ECC or CRC. At least one peripheral device includes a bus detection bus error detection circuitry checker.

At block 1005, the bus error detection circuitry checker forces an error on a communication bus. The bus detection bus error detection circuitry checker may force the error in response to a communication it receives via the bus (i.e., the bus detection bus error detection circuitry checker is a bus communication target device) or the bus detection bus error detection circuitry checker may initiate a bus communication that intentionally includes one or more errors (i.e., the bus detection bus error detection circuitry checker is a bus communication initiator device). The error may be forced on a write request or a read request communicated via the bus.

At block 1010, the bus detection bus error detection circuitry checker compares a response to the forced error by at least one separate device to an expected response to the error. For example, the bus detection bus error detection circuitry checker may send a write request that includes data intended to check operation of the ECC detection circuitry of the receiving device. The bus detection bus error detection circuitry checker confirms that the receiving device sends the correct error status in response. In another example, the bus detection bus error detection circuitry checker asserts an error status to a communication received from another device even though the communication is error-free. The bus detection bus error detection circuitry checker confirms that the sending device retries the communication.

At block 1015, the bus detection bus error detection circuitry checker generates an alert when the comparing indicates an error in the bus error detection circuitry of the other system device. The alert may be a message sent to the host device, an error signal asserted, or the alert may be a logged entry of the occurrence of the error by the detection circuitry.

The several examples of systems, devices, and methods described provide techniques for verifying that error detection circuitry is working. The techniques can be used in a communication infrastructure of a distributed computing system. Testing devices of the system can send validating data packets on the bus or buses of the system that contain precomputed values that validate the function of the error detection circuitry. Because the validation happens at the speed of the communication of data on the system, the validation can be very fast and multiple endpoints of the system can be validated simultaneously.

ADDITIONAL DESCRIPTION AND ASPECTS

A first Aspect (Aspect 1) includes subject matter (such as a memory device) comprising a memory array including memory cells to store memory data; error correcting code (ECC) circuitry configured to generate ECC data and use the ECC data to detect errors in the memory data; and an ECC circuitry checker. The ECC circuitry checker is configured to substitute the ECC data with check ECC data; compare an output of the ECC circuitry to an expected output when the substituted check ECC data is applied to the ECC circuitry; and generate an alert when the comparing indicates an error in the ECC circuitry.

In Aspect 2, the subject matter of Aspect 1 optionally includes ECC circuitry the includes ECC decoding circuitry configured to detect the errors in the memory data using the ECC data. The ECC circuitry checker is configured to apply the substituted check ECC data and the memory data to the ECC decoding circuitry and compare an output of the ECC decoding circuitry to an expected output of the ECC decoding circuitry.

In Aspect 3, the subject matter of one or both of Aspects 1 and 2 optionally includes ECC encoding circuitry configured to generate the ECC data for the memory data. The ECC circuitry checker is configured to substitute the check ECC data for the ECC data generated for the memory data and provide the check ECC data with the memory data instead of the generated ECC data in response to a read operation.

In Aspect 4 the subject matter of one or any combination of Aspects 1-3 optionally includes an ECC circuitry checker is configured to retrieve the check ECC data from a memory address mapped portion of the memory array in response to a read operation, and substitute the check ECC data for the ECC data generated for the memory data of the read operation.

In Aspect 5, the subject matter of one or any combination of Aspects 1-4 optionally includes ECC circuitry that includes ECC decoding circuitry configured to detect the errors in the memory data using the ECC data. The ECC circuitry checker is configured to flip at least one bit of the ECC data to generate the check ECC data and provide the generated check ECC data to the ECC decoding circuitry instead of the ECC data for the memory data.

In Aspect 6, the subject matter of one or any combination of Aspects 1-5 optionally includes ECC circuitry that includes ECC encoding circuitry configured to generate the ECC data for the memory data. The ECC circuitry checker is configured to flip at least one bit of the generated ECC data to generate the check ECC data.

In Aspect 7, the subject matter of one or any combination of Aspects 1-6 optionally includes an ECC circuitry checker that includes a multiplexer circuit configured to, in response to a read request to the memory device, substitute check ECC data for ECC data of memory data for the read request.

In Aspect 8, the subject matter of one or any combination of Aspects 1-7 optionally includes an ECC circuitry checker configured to substitute the ECC data with the check ECC data in response to a command received from a separate device.

In Aspect 9, the subject matter of one or any combination of Aspects 1-8 optionally includes an ECC circuitry checker that includes a finite state machine configured to recurrently substitute the ECC data with the check ECC data and compare the output of the ECC circuitry to the expected output.

In Aspect 10, the subject matter of one or any combination of Aspects 1-9 optionally includes memory cells include non-volatile memory cells.

In Aspect 11, the subject matter of one or any combination of Aspects 1-10 optionally includes memory cells that include one or more of static random access memory (SRAM) cells, static dynamic random access memory cells (SDRAM) cells, and memory register cells.

Aspect 12 can include subject matter (such as a computing system peripheral device) or can optionally be combined with one or any combination of Aspects 1-11 to include such subject matter, comprising a bus interface configured to communicate data with one or more separate devices via the bus, wherein the one or more separate devices include error correcting code (ECC) circuitry configured to generate ECC data and use the ECC data to detect data errors in data communicated via the bus, a bus ECC circuitry checker configured to force an error on the bus and compare a response of the one or more separate devices to the forced bus error to an expected response, and generate an alert when the comparing indicates an error in the ECC circuitry.

In Aspect 13, the subject matter of Aspect 12 optionally includes a bus ECC circuitry checker configured to force an error status in response to a write request received by the peripheral device.

In Aspect 14, the subject matter of one or both of Aspects 12 and 13 optionally includes a bus ECC circuitry checker configured to force an error in read data placed on the bus in response to a read request received by the peripheral device.

In Aspect 15, the subject matter of one or any combination of Aspects 12-14 optionally includes bus ECC circuitry checker that includes ECC decoding circuitry configured to check ECC data received in the write request.

In Aspect 16, the subject matter of one or any combination of Aspects 12-15 optionally includes logic circuitry configured to initiate sending a write request to the one or more separate devices via the bus, and a bus ECC circuitry checker configured to force an error in one or both of write data and a write address included in the write request and compare a returned status of the write request to an expected returned status.

In Aspect 17, the subject matter of one or any combination of Aspects 12-16 optionally includes logic circuitry configured to initiate sending a read request to the one or more separate devices via the bus, and an bus ECC circuitry checker that includes ECC decoding circuitry configured to check ECC data received in response to the read request.

In Aspect 18, the subject matter of one or any combination of Aspects 12-18 optionally includes logic circuitry configured to initiate sending a write request to a separate device of the one or more separate devices via the bus, wherein the write request includes a write address and write data; and initiate a read request to the separate device, wherein a read address of the read request is the write address of the write request. The bus ECC circuitry checker includes ECC decoding circuitry configured to check ECC data returned in a response to the read request.

Aspect 19 includes subject matter (or can optionally be combined with one or any combination of Examples 1-18 to include such subject matter, comprising a host device, a system bus, and a memory device. The memory device includes a bus interface, a memory array including memory cells to store memory data received from the host device via the bus, error detection circuitry configured to generate error detection data and use the error detection data to detect errors in the memory data, and a memory error detection circuitry checker. The memory error detection circuitry checker is configured to substitute the error detection data with check error detection data, compare an output of the error detection circuitry to an expected output when the substituted check error detection data is applied to the error detection circuitry, and generate an alert when the comparing indicates an error in the error detection circuitry.

In Aspect 20, the subject matter of Aspect 19 optionally includes a peripheral device including a bus interface configured to communicate data with the host device and the memory device via the bus. The host device and the memory device further include bus error detection circuitry to detect a bus error. The peripheral device includes a bus error detection circuitry checker configured to force an error on the bus and compare a response of one or both of the host device and the memory device to the forced bus error to an expected response, and generate an alert when the comparing indicates an error in the bus error detection circuitry of one or both of the host device and the memory device.

The non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A memory device comprising:
a memory array including memory cells to store memory data;
error correcting code (ECC) circuitry configured to generate ECC data and use the ECC data to detect errors in the memory data; and
an ECC circuitry checker configured to:
translate a memory address of a memory operation to a memory address mapped portion of the memory array as part of an ECC checking operation;
retrieve check ECC data from the memory address mapped portion of the memory array according to the translated memory address, wherein the check ECC data is used to detect errors in the ECC circuitry;
substitute the ECC data with the check ECC data from the memory address mapped portion of the memory array to check the functioning of the ECC circuitry;
compare an output of the ECC circuitry to an expected ECC circuitry output when the substituted check ECC data is applied to the ECC circuitry; and
generate an alert when the comparing indicates an error in the ECC circuitry of the memory device.

2. The memory device of claim 1,
wherein the ECC circuitry includes ECC decoding circuitry configured to detect the errors in the memory data using the ECC data; and
wherein the ECC circuitry checker is configured to apply the substituted check ECC data and the memory data to the ECC decoding circuitry and compare an output of the ECC decoding circuitry to an expected output of the ECC decoding circuitry.

3. The memory device of claim 1,
wherein the ECC circuitry includes ECC encoding circuitry configured to generate the ECC data for the memory data; and
wherein ECC circuitry checker is configured to substitute the check ECC data for the ECC data generated for the memory data and provide the check ECC data with the memory data instead of the generated ECC data in response to a read operation.

4. The memory device of claim 1, wherein the ECC circuitry checker is configured to:
retrieve check memory data from the memory address mapped portion of the memory array in response to a read operation; and
substitute the check EGG memory data for the memory data of the read operation.

5. The memory device of claim 1,
wherein the ECC circuitry includes ECC decoding circuitry configured to detect the errors in the memory data using the ECC data; and
wherein ECC circuitry checker is configured to flip at least one bit of the ECC data to generate the check ECC data and provide the generated check ECC data to the ECC decoding circuitry instead of the ECC data for the memory data.

6. The memory device of claim 1,
wherein the ECC circuitry includes ECC encoding circuitry configured to generate the ECC data for the memory data; and
wherein the ECC circuitry checker is configured to flip at least one bit of the generated ECC data to generate the check ECC data.

7. The memory device of claim 1, wherein the ECC circuitry checker includes a multiplexer circuit configured to, in response to a read request to the memory device, substitute check ECC data for ECC data of memory data for the read request.

8. The memory device of claim 1, wherein the ECC circuitry checker is configured to substitute the ECC data with the check ECC data in response to a command received from a separate device.

9. The memory device of claim 1, wherein the ECC circuitry checker includes a finite state machine configured to recurrently substitute the ECC data with the check ECC data and compare the output of the ECC circuitry to the expected output.

10. The memory device of claim 1, wherein the memory cells include non-volatile memory cells.

11. The memory device of claim 1, wherein the memory cells include one or more of static random access memory (SRAM) cells, static dynamic random access memory cells (SDRAM) cells, and memory register cells.

12. A computing system peripheral device for connecting to a bus of the computing system, the peripheral device comprising:
a bus interface configured to communicate data with one or more separate devices via the bus, wherein the one or more separate devices include error correcting code (ECC) circuitry configured to generate ECC data and use the ECC data to detect data errors in data communicated via the bus;
logic circuitry configured to initiate sending a write request to the one or more separate devices via the bus; and
a bus ECC circuitry checker configured to:
force an error on the bus and compare a response of the ECC circuitry of the one or more separate devices to the forced bus error to an expected response of the ECC circuitry;
generate an alert when the comparing indicates an error in the ECC circuitry; and
force an error in one or both of write data and a write address included in the write request and compare a returned status of the write request to an expected returned status.

13. The peripheral device of claim 12, wherein the bus ECC circuitry checker is configured to:
force an error status in response to a write request received by the peripheral device.

14. The peripheral device of claim 12, wherein the bus ECC circuitry checker is configured to force an error in read data placed on the bus in response to a read request received by the peripheral device.

15. The peripheral device of claim 12, wherein the bus ECC circuitry checker includes ECC decoding circuitry configured to check ECC data received in the write request.

16. The peripheral device of claim 12, including:
logic circuitry configured to initiate sending a read request to the one or more separate devices via the bus; and
wherein the bus ECC circuitry checker includes ECC decoding circuitry configured to check ECC data received in response to the read request.

17. The peripheral device of claim 12, including:
logic circuitry configured to:
initiate sending a write request to a separate device of the one or more separate devices via the bus, wherein the write request includes a write address and write data; and
initiate a read request to the separate device, wherein a read address of the read request is the write address of the write request;

wherein the bus ECC circuitry checker includes ECC decoding circuitry configured to check ECC data returned in a response to the read request.

18. A computing system comprising:

a host device;

a system bus; and a memory device including:

a bus interface;

a memory array including memory cells to store memory data received from the host device via the bus;

error detection circuitry configured to generate error detection data and use the error detection data to detect errors in the memory data; and a memory error detection circuitry checker configured to:

translate a memory address of a memory operation to a memory address mapped portion of the memory array as part of an error detection circuitry checking operation;

retrieve check error detection data from the memory address mapped portion of the memory array according to the translated memory address, wherein the check error detection data is used to detect errors in the error detection circuitry;

substitute the error detection data with check error detection data from the memory address mapped portion of the memory array to check the functioning of the error detection circuitry;

compare an output of the error detection circuitry to an expected output when the substituted check error detection data is applied to the error detection circuitry; and generate an alert when the comparing indicates an error in the functioning of the error detection circuitry.

19. The computing system of claim 18, including:

a peripheral device including a bus interface configured to communicate data with the host device and the memory device via the bus;

wherein the host device and the memory device further include bus error detection circuitry to detect a bus error; and wherein the peripheral device includes a bus error detection circuitry checker configured to:

force an error on the bus and compare a response of one or both of the host device and the memory device to the forced bus error to an expected response; and generate an alert when the comparing indicates an error in the bus error detection circuitry of one or both of the host device and the memory device.

* * * * *